(12) United States Patent
Magni et al.

(10) Patent No.: US 8,813,764 B2
(45) Date of Patent: Aug. 26, 2014

(54) METHOD AND APPARATUS FOR PHYSICAL CONFINEMENT OF A LIQUID MENISCUS OVER A SEMICONDUCTOR WAFER

(75) Inventors: Enrico Magni, Pleasanton, CA (US); Eric Lenz, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 419 days.

(21) Appl. No.: 12/475,466

(22) Filed: May 29, 2009

(65) Prior Publication Data

US 2010/0300492 A1 Dec. 2, 2010

(51) Int. Cl.
*B08B 11/00* (2006.01)

(52) U.S. Cl.
USPC ........ 134/95.1; 134/94.1; 134/95.2; 134/99.1

(58) Field of Classification Search
None
See application file for complete search history.

(56) References Cited

U.S. PATENT DOCUMENTS

| 7,389,783 B2 | 6/2008 | Woods et al. | |
| 2004/0069319 A1* | 4/2004 | Boyd et al. ...................... | 134/1.3 |
| 2006/0005860 A1* | 1/2006 | Garcia ............................ | 134/26 |
| 2007/0107756 A1 | 5/2007 | Woods et al. | |
| 2007/0218653 A1 | 9/2007 | Larios et al. | |
| 2008/0078421 A1* | 4/2008 | O'Donnell et al. ............... | 134/2 |
| 2008/0081775 A1 | 4/2008 | O'Donnell et al. | |
| 2008/0169008 A1 | 7/2008 | Yun et al. | |
| 2009/0145464 A1 | 6/2009 | Ravkin et al. | |

OTHER PUBLICATIONS

PCT International Search Report—PCT/US 10/01495—Dated Jul. 23, 2010 (2 pages).

* cited by examiner

*Primary Examiner* — Michael Kornakov
*Assistant Examiner* — Ryan Coleman
(74) *Attorney, Agent, or Firm* — Martine Penilla Group, LLP

(57) ABSTRACT

Apparatus, methods and systems for physically confining a liquid medium applied over a semiconductor wafer include a first and a second chemical head that are disposed to cover at least a portion of a top and an underside surface of the semiconductor wafer. Each of the first and the second chemical heads include an angled inlet conduit at a leading edge of the respective chemical heads to deliver liquid chemistry into a pocket of meniscus in a single phase. The pocket of meniscus is defined over the portion of the top and underside surface of the semiconductor wafer covered by the chemical heads and is configured to receive and contain the liquid chemistry applied to the surface of the semiconductor wafer as a meniscus. A step is formed at a leading edge of the first and second chemical heads along an outer periphery of the pocket of meniscus to substantially confine the meniscus of the liquid chemistry within the pocket of meniscus. The step covers at least a portion of the pocket of meniscus and the step's height is sufficient to preserve confinement characteristic of the meniscus. An inner return conduit is defined within the pocket of meniscus at a trailing edge of the respective chemical heads and is used to remove the liquid chemistry from the surface of the semiconductor wafer in a single phase after the cleaning process.

18 Claims, 10 Drawing Sheets

Asymmetric Confinement Rinse Heads

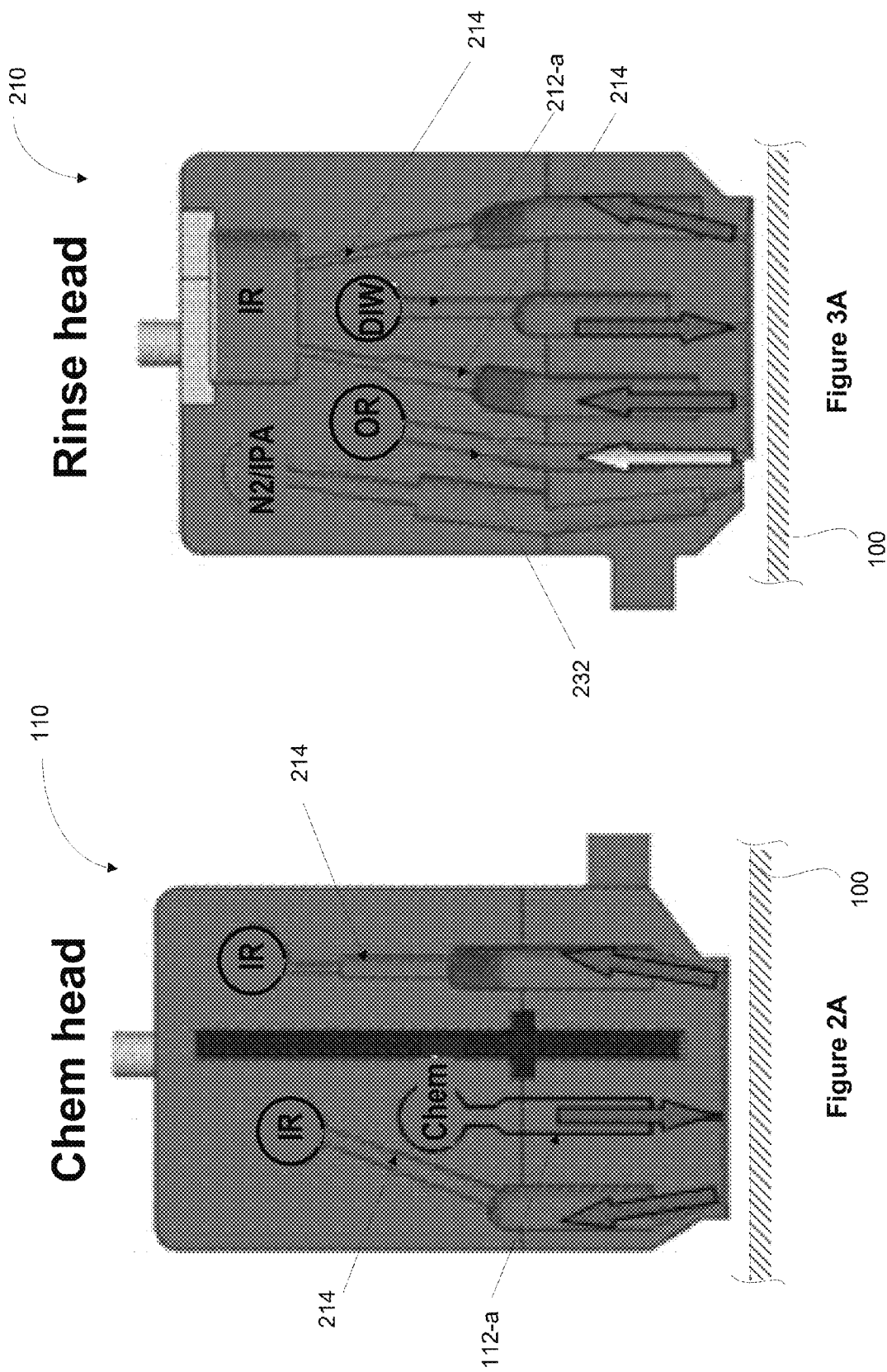

METHOD AND APPARATUS FOR PHYSICAL CONFINEMENT OF A LIQUID MENISCUS OVER A SEMICONDUCTOR WAFER

CROSS REFERENCE TO RELATED APPLICATION

This application is related to U.S. patent application Ser. No. 12/194,308 filed on Aug. 19, 2008, and entitled "REMOVING BUBBLES FROM A FLUID FLOWING DOWN THROUGH A PLENUM," and to U.S. patent application Ser. No. 11/532,491, filed on Sep. 15, 2006, entitled "Method and Material for Cleaning a Substrate." This application is also related to U.S. Patent Application No. 61/013,950 filed on Dec. 14, 2007, and entitled "MATERIALS AND METHODS FOR PARTICLE REMOVAL BY SINGLE-PHASE AND TWO-PHASE MEDIA." The aforementioned patent applications are incorporated herein by reference.

BACKGROUND OF THE INVENTION

1. Field of the Invention

The present invention relates generally to cleaning of a semiconductor wafer and, more particularly, to physical confinement of a liquid meniscus applied on the surface of the semiconductor wafer during a cleaning process.

2. Description of the Related Art

It is well-known in the art that there is a need to clean and dry a solid surface, such as a semiconductor wafer, that has undergone a fabrication operation which leaves unwanted residues on the solid surface. Examples of such fabrication operations include plasma etching (e.g., via etch or trench etch for copper dual damascene applications) and chemical mechanical polishing (CMP). Various cleaning processes involve applying a liquid chemistry to the semiconductor wafer as a meniscus and removing the liquid chemistry along with the released contaminants. It is important to maintain the meniscus over the surface of the semiconductor wafer so that the liquid chemistry can work to release the particle contaminants from the surface of the semiconductor wafer. Conventional cleaning processes use proximity heads to apply the liquid chemistry to one side or to both sides of the wafer and confining the meniscus through large air flow. Vacuum is then used to provide sucking action to entrain the liquid chemistry. The conventional confinement of liquid chemistry using large air flow has its own disadvantages. For instance, the liquid chemistry is exposed to the large air flow resulting in substantial loss of the liquid chemistry due to evaporation. Some of the liquid chemistry used in the cleaning process is very expensive and any loss of liquid chemistry adds to the cost of cleaning.

Evaporation of the liquid chemistry in conventional cleaning processes is a serious issue, especially when using proximity heads. Specifically, due to high ambient air flow through the proximity heads, it is difficult to control evaporation loss of the liquid chemistry. Additionally, in order to improve the cleaning process, it is common to introduce the liquid chemistry at a higher temperature, typically about 30 degrees Celsius to about 60 degrees Celsius. Liquid chemistry loss can dramatically increase when liquid chemistry is applied at a higher temperature. This is due to the fact that vapor pressure exponentially increases with temperature and as evaporation is directly related to vapor pressure, evaporation also increases. As a result, the amount of liquid chemistry that can be reclaimed for reuse dramatically decreases.

Another factor for consideration is the effect the high temperature liquid chemistries have on the conventional cleaning apparatus, such as chemical heads, used in supplying these liquid chemistries. Most of the conventional cleaning apparatus operate optimally at room temperature. However, static temperature gradient that naturally develops because of higher temperature of the liquid chemistries cause these cleaning apparatus to deform resulting in mediocre operation of the apparatus during cleaning.

Another disadvantage of the use of air for confining the meniscus is the cost of generating vacuum in the presence of this large flow of air. The design requirement for generating the vacuum has to take into consideration this large air flow requirement so as to provide an effective tool for cleaning.

Moreover, evaporation can result in significant changes in the cleaning process by liquid chemistry due to the chemical depletion or change in concentration of the liquid chemistry. Chemical depletion occurs when the ambient air flow mixes with the hot liquid chemistry resulting in vapor that is saturated with air and components of the liquid chemistry making it hard to isolate and reclaim the liquid chemistry. Excessive concentration of chemicals, on the other hand, commonly results with the use of proprietary chemistry. Proprietary chemistry contains non-volatile components and, if the proprietary chemistry is aqueous-based, evaporation causes the concentration of non-volatile components to increase over time. This increase in the concentration of non-volatile components can adversely affect the cleaning performance of the liquid chemistry. Moreover, if the concentration of the liquid chemistry increases too much, there might be significant damage to the semiconductor wafer.

In view of the foregoing, there is a need for an alternate solution that avoids use of air flow to confine the liquid meniscus. It is in this context that embodiments of the invention arise.

SUMMARY OF THE INVENTION

Broadly speaking, the present invention fills these needs by providing a cleaning mechanism that is capable of preserving confinement characteristics of the liquid medium applied to a semiconductor wafer without use of air flow. It should be appreciated that the present invention can be implemented in numerous ways, including as a process, an apparatus, or a system. Several inventive embodiments of the present invention are described below.

In one embodiment, a method for physically confining a liquid medium meniscus over a semiconductor wafer, is provided. The method includes delivering a liquid chemistry into a pocket of meniscus defined on a surface of the semiconductor wafer. The pocket of meniscus is defined between a first and a second chemical head. The liquid chemistry is delivered into the pocket of meniscus in a single phase through angled inlet conduits defined at the first and second chemical heads, respectively. A step is defined along at least a portion of an outer periphery of the pocket of meniscus such that the height of the step is sufficient to preserve the confinement characteristics of the liquid chemistry. The liquid chemistry is removed through inner return conduits. The inner return conduits are defined at a trailing edge of the first and second chemical heads within the pocket of meniscus such that the liquid chemistry may be removed from the semiconductor wafer surface in a single phase.

In another embodiment, an apparatus for physically confining a liquid medium applied over a semiconductor wafer, is provided. The apparatus includes a first and a second chemical head that are disposed to cover at least a portion of a top and an underside surface of the semiconductor wafer. Each of the first and the second chemical heads includes an angled inlet conduit at a leading edge of the respective chemical heads so as to deliver liquid chemistry into a pocket of meniscus in a single phase. The pocket of meniscus is defined over the portion of the top and underside surface of the semiconductor wafer covered by the chemical heads. The pocket of meniscus is configured to receive and contain the liquid chemistry applied to the surface of the semiconductor wafer as a meniscus. A step is formed along an outer periphery of the pocket of meniscus at a leading edge of the first and second chemical heads so as to substantially confine the meniscus of the liquid chemistry within the pocket of meniscus. The step is defined such that at least a portion of the pocket of meniscus is covered by the step and step's height is sufficient to preserve confinement characteristic of the meniscus. An inner return conduit is located within the pocket of meniscus at a trailing edge of the respective chemical heads. The inner return conduit is used to remove the liquid chemistry from the surface of the semiconductor wafer in a single phase after the cleaning process.

In yet another embodiment of the invention, a system for physically confining a meniscus of a liquid medium applied over a semiconductor wafer is provided. The system includes a carrier mechanism to receive, support and transport the semiconductor wafer along an axis. A first and a second chemical head are disposed to cover at least a portion of a top and an underside surface of the semiconductor wafer. The first and second chemical heads define a pocket of meniscus to receive the liquid medium applied by the first and the second chemical heads during a chemical clean. A first and a second rinse head are disposed to cover at least a portion of a top and an underside surface of the semiconductor wafer. The first and the second rinse heads are configured to provide rinsing chemistry into a pocket of meniscus defined over the portion of the wafer covered by the rinse heads to substantially rinse the surface of the semiconductor wafer after the chemical clean. Each of the first chemical head, the second chemical head, the first rinse head and the second rinse head include an angled inlet conduit to deliver one of liquid or rinsing chemistry in a single phase into the pocket of meniscus. The angled inlet conduit is located within the pocket of meniscus at a leading edge of the corresponding chemical or rinse heads. A step is formed along an outer periphery of the meniscus at a leading edge of the corresponding chemical head or rinse head so as to substantially confine the meniscus of the liquid chemistry and the rinsing chemistry within the pocket of the meniscus. The step is defined such that a height of the step is sufficient to preserve confinement characteristic of the meniscus. An inner return conduit to remove one of the liquid or rinsing chemistry from the surface of the wafer is defined in each of the chemical heads and rinse heads, respectively. The inner return conduit is located within the pocket of meniscus at a trailing edge of the corresponding chemical or rinse heads such that the liquid or rinsing chemistry may be removed from the surface of the semiconductor wafer in a single phase. The angled inlet conduit at each of the heads is defined close to but spaced apart from the step and directed towards the pocket of meniscus so as to enable delivery of the liquid chemistry and rinsing chemistry into the pocket of meniscus in a single phase.

The advantages of using the mechanism include substantial reduction or elimination of air flow to contain the meniscus. Eliminating air flow during containment results in preserving liquid chemistry which would have been otherwise lost due to evaporation. The process allows for simpler tuning to preserve the confinement and other characteristics of the liquid meniscus. By preserving the characteristics of the liquid chemistry, optimal chemical clean can be achieved without considerable damage to the wafer. Further, the mechanism allows for reclaiming and reusing the costly liquid chemistry, thereby making this a more cost-effective and efficient cleaning solution.

Other aspects and advantages of the present invention will become apparent from the following detailed description, taken in conjunction with the accompanying drawings, illustrating by way of example the principles of the present invention.

BRIEF DESCRIPTION OF THE DRAWINGS

The present invention will be readily understood by the following detailed description in conjunction with the accompanying drawings. To facilitate this description, like reference numerals designate like structural elements.

FIG. 2A illustrates an alternate embodiment of the chemical head with an inlet conduit disposed normal to a plane of liquid meniscus.

FIG. 3A illustrates an alternate embodiment of the rinse head with an inlet conduit disposed normal to a plane of liquid meniscus.

DETAILED DESCRIPTION OF THE PREFERRED EMBODIMENTS

Figure 1:
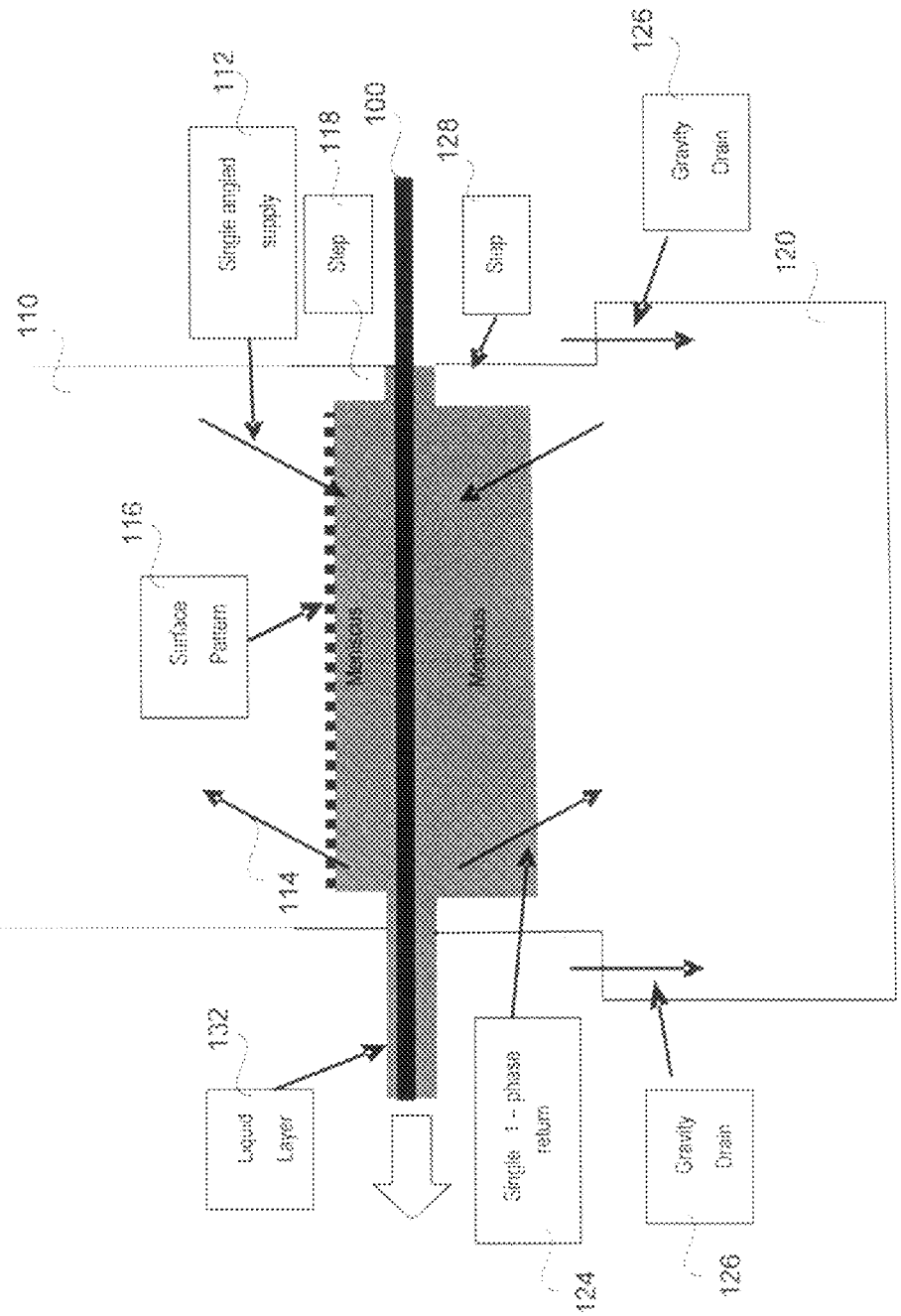
FIG. 1 illustrates a cross-sectional view of a simplified chemical head used in confining a liquid meniscus over a semiconductor wafer, in one embodiment of the invention.

Several embodiments for effectively confining a liquid meniscus over a semiconductor wafer are now described. It will be obvious, however, to one skilled in the art, that the present invention may be practiced without some or all of these specific details. In other instances, well known process operations have not been described in detail in order not to unnecessarily obscure the present invention.

Embodiments of the invention provide a mechanism for physically confining a liquid meniscus applied to a semiconductor wafer without the use of air flow. The mechanism uses proximity dispense heads with angled inlet conduits to deliver liquid chemical to the surface of the wafer. A pocket of meniscus is defined by a first and a second dispense head on at least a portion of the wafer exposed to the first and second dispense heads. An angled inlet conduit to deliver liquid chemical is defined in the first and second dispense heads such that the liquid chemical can be received within the defined pocket of meniscus in a single phase. A step feature, covering at least a portion of an outer peripheral region of the pocket of meniscus, is defined at each of the first and second dispense heads such that the height of the step is sufficient to preserve the confinement characteristics of the liquid meniscus. The first and the second dispense heads are misaligned such that a wall of the step adjoining the pocket of meniscus in the second dispense head is extended outward with respect to the wall of the step adjoining the pocket of meniscus in the first dispense head. An inner return conduit is defined within the pocket of meniscus at a trailing edge of the first and second dispense heads to enable removal of the liquid chemistry from the pocket of meniscus in a single phase.

The embodiments of the invention provide an efficient mechanism to confine a meniscus of a liquid chemistry applied over a wafer so that the liquid chemistry may be introduced and removed in a single phase. The mechanism avoids the use of air flow for confining the meniscus and with it the associated disadvantages that might have otherwise contaminated or chemically altered the liquid chemistry resulting in wastage of the liquid chemistry. Additionally, the mechanism further prevents any loss of the liquid chemistry due to evaporation when exposed to the air flow. As the liquid medium used in the cleaning process are expensive, reclaiming and reusing of the liquid meniscus is highly desirable. Thus, by introducing and removing liquid medium in single phase and avoiding the use of air flow, the embodiments of the invention provide ways to preserve the liquid medium without compromising on the quality of cleaning of the wafer. The preserved liquid medium can be reused in the current or subsequent cleaning operation making this an optimal and cost-effective solution.

With the above general understanding of the mechanism used to provide physical confinement of liquid meniscus applied over a semiconductor wafer, different embodiments of the invention will now be described in detail with reference to the various drawings.

FIG. 1 illustrates a side view of a simple block diagram of a mechanism using chemical head for dispensing and removing liquid chemistry, in one embodiment of the invention. As shown, the mechanism includes a first chemical head 110 and a second chemical head 120 positioned to cover at least a portion of a top and underside surface of a wafer 100. A pocket of meniscus 130 is defined in the portion covered by the first and second chemical heads, 110, 120. The wafer 100 is disposed over a carrier (not shown) and is moved along an axis. When the wafer 100 slides through the pocket of meniscus, the pocket of meniscus is split into two menisci with one meniscus covering the portion of the top surface of the wafer and the other meniscus covering the portion of the bottom surface of the wafer covered by the chemical heads, 110, 120. Once the wafer 100 moves out of the menisci region, the pocket of meniscus becomes a single meniscus. In one embodiment, the chemical heads 110 and 120 are proximity heads. The embodiments are not restricted to proximity heads but may include other types of heads or mechanism that can generate a pocket of meniscus 130 covering at least a portion of the wafer 100. A liquid medium, such as liquid chemistry, is introduced into the pocket of meniscus 130 during a cleaning operation. A step is defined in each of the first and the second chemical head on the outer periphery of the pocket of meniscus 130. The steps, 118, 128, act as physical confinement walls for the pocket of meniscus thereby confining and maintaining the meniscus region.

An inlet conduit is defined in each of the first chemical head 110 and second chemical head 120, respectively, to introduce the liquid chemistry into the pocket of meniscus for application to the portion of the surface of the wafer 100 exposed to the meniscus. In one embodiment, the inlet conduits, 112 and 122, are located at the edge of the meniscus but just inside the pocket of meniscus. Since the inlet conduits are located at the edge of the meniscus, the inlet conduits are pointed inward at an angle normal to a plane of the meniscus so that the liquid chemistry is introduced directly into the pocket of meniscus 130 away from the step 118, 128, in a single phase. For more information on single phase delivery, reference can be made to U.S. application Ser. No. 12/194,308 filed on Aug. 19, 2008, entitled "REMOVING BUBBLES FROM A FLUID FLOWING DOWN THROUGH A PLENUM" and assigned to the assignee of the current application, which is incorporated herein by reference.

Optimum meniscus confinement is obtained when the liquid chemistry is delivered into the pocket of meniscus close to the step, 118, 128, on the wafer entrance side. By providing angled inlet conduits, 112, 122, to deliver the liquid chemistry close to but pointed away from the step, the momentum of the liquid chemistry delivery flow is directed away from the physical confinement wall. This prevents the liquid flow kinetic energy and the related pressure force from breaking the meniscus surface, thus, maintaining the confinement characteristics of the meniscus.

The step, 118, 128, can surround the pocket of meniscus either completely or partially. In one embodiment, the step surrounds the pocket of meniscus completely. In this embodiment, a single inlet conduit, 112, 122, and a single inner return conduit, 114, 124, respectively, are defined in each of the chemical heads 110, 120, respectively. In another embodiment, the step surrounds the pocket of meniscus partially. In this embodiment, the step may cover the wafer entrance at a leading edge of the pocket of meniscus 130 formed by the chemical heads, 110, 120, and along at least a portion of the lateral sides of the pocket of meniscus 130. In this embodiment, the inlet conduit, 112, 122, defined in each of the first and second chemical heads, 110, 120, include at least a row of inlet conduits defined along the inner edge of the pocket of meniscus and at least a row of inner return conduits along the inner edge at the trailing edge of the pocket of meniscus 130. Using a row of inlet conduits to deliver and a row of inner return conduits to remove the liquid chemistry, it is possible to employ low flow capability while maintaining flow uniformity when delivering and removing the liquid chemistry. This results in a cost effective application of the liquid chemistry.

Figure 5:
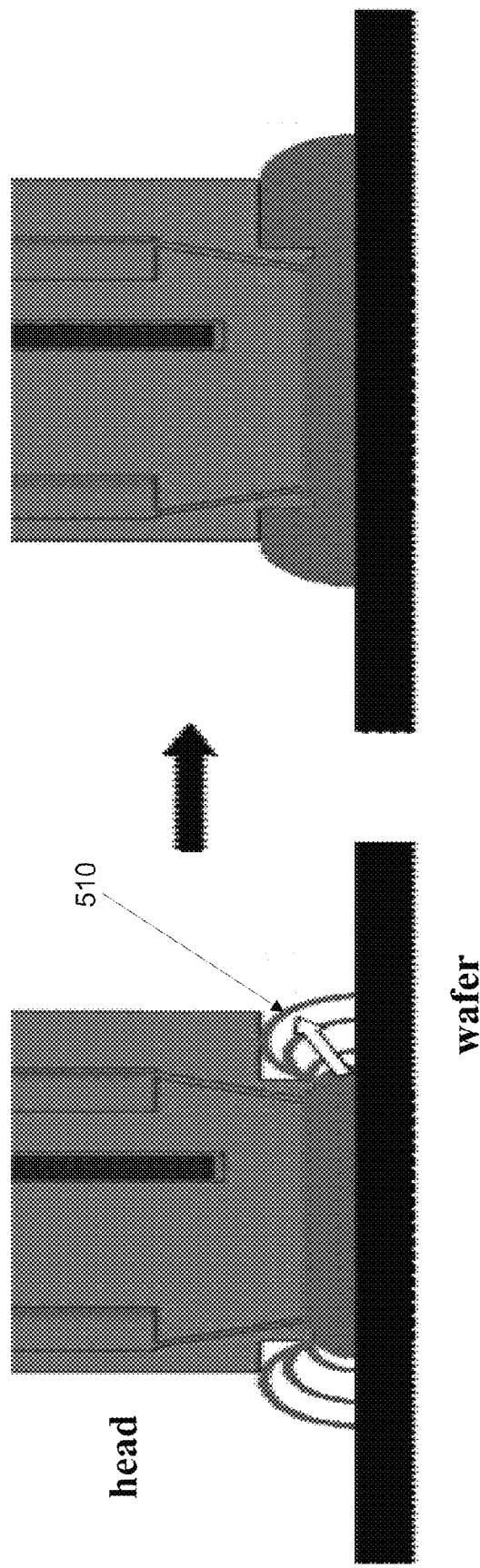
FIG. 5 illustrates the effect of pressure on the meniscus curvature, in one embodiment of the invention.

In addition to providing the physical confinement wall for the pocket of meniscus in the chemical heads, 110, 120, the step, 118, 128, is designed such that the height of the step, 118, 128, is sufficient to prevent the liquid medium from losing its confinement characteristics. As the liquid medium is delivered into the pocket of meniscus, gravitational force acts on the liquid medium and tends to force at least some of the liquid medium to flow out of the pocket of meniscus. As the liquid flows out of the pocket of meniscus, the liquid medium may lose its confined meniscus shape if it comes in contact with a layer of liquid formed outside the pocket of meniscus. The layer of liquid may normally be formed on a top surface of the step outside the pocket of meniscus due to any number of reasons. For instance, during the introduction of the wafer, the pressure of the meniscus fluctuates when the substrate and the carrier transporting the substrate enter or exit the pocket of meniscus. The meniscus pressure may also fluctuate based on fluctuation associated with liquid chemistries delivery and inner return flow. As a result of the meniscus pressure fluctuation, the meniscus curvature fluctuates. An exemplary chemical head with the expanded surface of the liquid chemistry is illustrated in FIG. 5. As the meniscus curvature increases, the surface becomes more convex, as illustrated by 510. As a result, the liquid chemistry expands outside of the pinning corners. When the liquid surface touches any surface of the head outside of the physical confinement wall, the liquid wets all those surfaces outside the physical confinement wall till a new meniscus pinning feature is reached (a sharp corner). The resulting meniscus may still be confined, but not in the desired region. The process of meniscus jumping from the desired confinement wall to the undesired expanded meniscus is regulated by the energy required to activate the jump. This energy depends on the geometry of the head outside the physical confinement wall and on the liquid surface tension.

In order to prevent the liquid medium from losing its meniscus confinement characteristics, the height of the step outside the pocket of meniscus in the first and second chemical heads is increased sufficiently so that the liquid medium flowing out of the pocket of meniscus will not be able to interface with the layer of liquid formed on the top surface of the step. The increase in the height of the step is directly related to one or more operating constraints associated with the liquid meniscus and the chemical heads, 110, 120, and is defined as a function of the operating constraints. The operating constraints include one or more of flow rate, pressure, temperature, chemical composition of the liquid medium, proximity of the chemical head surface to the surface of the wafer, and the dimensions of the chemical head. These operating constraints are dynamic. For instance, the pressure of the meniscus fluctuates when the wafer enters or exits the pocket of meniscus. As a result, the height of the step need to consider the fluctuation in the one or more operating constraints so that optimal meniscus containment may be achieved.

Figure 6:
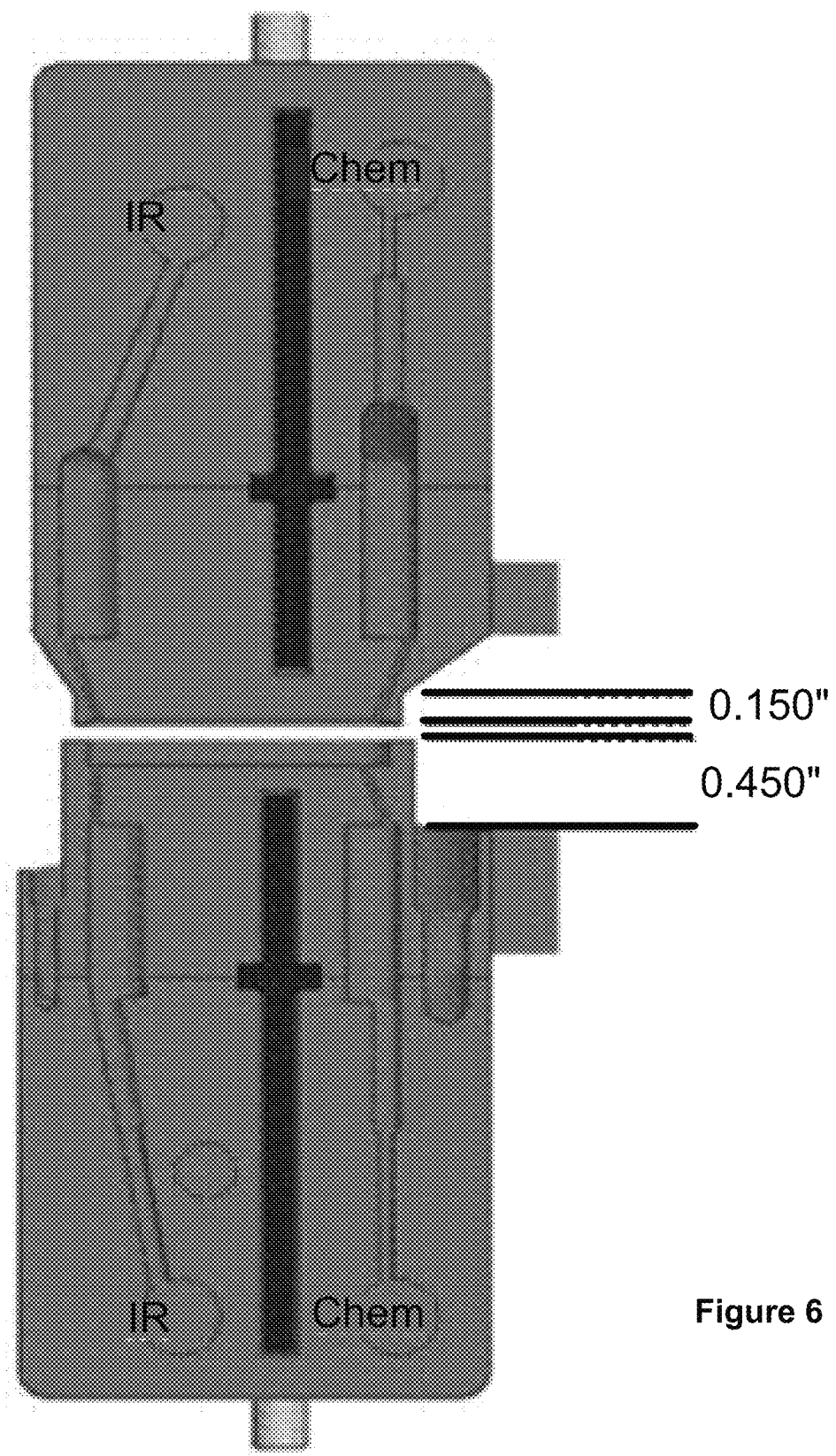
FIG. 6 illustrates a correct step height outside confinement wall taking into consideration pressure fluctuation in the meniscus layer, in one embodiment of the invention.

In one embodiment, the height of the step is directly related to the probability that the liquid chemistry 3-phase contact line jumps outside the desired meniscus boundary line. As the operational pressure in the liquid medium fluctuates, the meniscus can go unconfined if the step height is too low. The operational pressure depends on the chemical head geometry, proximity of the head to the wafer surface and the flow rate of the liquid medium, among other constraint parameters. As a result, the height of the step is increased so that the meniscus can be substantially confined. In one embodiment, the step height outside of the confinement wall is defined to be larger than 0.120" or about 3 mm. FIG. 6 illustrates an example of a correct chemical head design with a defined outside confinement wall.

To optimize the use of liquid chemistry, the chemical heads, 110 and 120, each include inner return conduits, 114, 124, respectively, defined within the pocket of the meniscus. The inner return conduits, 114, 124, are located at the trailing end of the chemical heads, 110, 120, so that the liquid chemistry may be removed in a single phase after the cleaning operation. The inner return conduits, 114, 124, are located in a region of the head that is in full contact with the liquid so that only liquid chemistry is returned through the inner return conduits. The number and position of the inner return conduits may vary depending on the design and functionality desired. The removed liquid chemistry may be reused in subsequent cleaning operations.

The chemical head 120, disposed on the underside of the wafer also includes a gravity drain 126 to receive any liquid chemistry that may overflow from the wafer surface during temporary unconfinement. Temporary unconfinement may occur when the carrier and the wafer 100 enter or exit the pocket of meniscus. When this happens, the meniscus pressure increases temporarily, potentially causing liquid chemistry spillage. The gravity drain 126 may be located at the leading edge, the trailing edge or at both the leading edge and trailing edge of the chemical head 120. The liquid chemistry collected in the gravity drain 126 may be reused, thereby making optimal use of the liquid chemistry. In the embodiment where physical confinement is provided all around the meniscus, a small flow of liquid continuously overflows into the gutter. This is required by design as the delivery and the inner return flows cannot be made precisely identical. To assure that the meniscus region is always filled with liquid, the delivery flow is made larger than the inner return flow. In one embodiment, the delivery flow is about 100 ml/min larger than the inner return flow. The excess flow is returned through the gutter and re-used. As the wafer moves away from the chemical heads 110, 120, a layer of liquid chemistry 132 may remain on the wafer. The layer may remain on the wafer to prevent other contaminants from adhering to the surface of the wafer or to prevent premature drying.

In one embodiment, the chemical head disposed over the top of the wafer 100 may include a pattern 116, such as hemi-wicking topography, on a surface that is facing the top of the wafer. This topography is to enhance the surface wetting by the liquid chemistry. For instance, the surface within the pocket of meniscus over the top of the wafer 100 between the angled inlet conduit 112 and inner return conduit 114 may have the hemi-wicking surface topography to increase the wetting of the liquid chemistry within the pocket so as to improve the cleaning process. For more information on hemi-wicking surface topography, reference can be made to U.S. application Ser. No. 12/471,169 filed on May 22, 2009, entitled "MODIFICATION TO SURFACE TOPOGRAPHY OF PROXIMITY HEAD" and assigned to the assignee of the current application, which is incorporated herein by reference.

There is a possibility for residual liquid to be present between the upper and lower heads in the meniscus region, after the liquid delivery is turned off. As the wafer completes processing, the wafer is delivered at the wafer output area and the wafer carrier returns to the wafer input area. As the empty carrier travels backwards through the proximity heads, any leftover liquid chemistry present in the meniscus area between the heads may wet the carrier surface if the level of the carrier plane is at the level of the liquid chemistry. This can be avoided if the pocket of the lower head is deeper than the maximum height a liquid puddle can have on a flat surface. In one embodiment, the pocket depth can be calculated using an empirical formula provided in Table 1. The empirical formula is obtained using various process parameters associated with the application of the liquid chemistry. Based on the calculation, the lower head pocket depth is designed to be at least 0.130" or 3.3 mm, in one embodiment. This assures that the residual liquid chemistry possibly stagnating on the bottom of the head pocket cannot reach the carrier plane. Larger pocket depths would produce the same results but would necessitate increase in the meniscus volume. It should be noted, that the word substrate and wafer are used interchangeably to mean a material upon which semiconductor devices are fabricated.

TABLE 1

$$e = 2 \kappa^{-1} \sin\left(\frac{\vartheta_E}{2}\right) \kappa^{-1} = \sqrt{\frac{\gamma}{\rho g}}$$

TABLE 1-continued wherein e is the height of a liquid puddle on a flat surface, $\theta_E$ is the equilibrium contact angle of water on the head material (PVDF), $\kappa^{-1}$ is the capillary length, $\gamma$ is the surface tension, $\rho$ is the density, and g is the gravitational acceleration.
* For water at 20° C., e = 3.5 mm (0.138"). Measured height: 0.130"
* For water at 80° C., e = 3.1 mm (0.123")
Lower head pocket depth: 0.130"

A wall of the step adjacent to the pocket of meniscus in each of the chemical heads, 110, 120, disposed at the top and underside of the wafer 100 is offset from each other to better confine the meniscus. Neglecting gravitational force, the meniscus surface is described by a section of a circle. In the presence of an overpressure in the meniscus, the liquid surface is convex with portion of the meniscus being outside of the meniscus confinement wall. Considering gravitational force on the meniscus surface, the weight of the liquid can induce a pressure on the meniscus surface larger than what the surface tension can sustain, inducing leakage of the liquid into the gutter. By offsetting the position of the lower step wall defining the physical confinement in respect to the upper step wall, footing can be provided to counter balance the force induced by the weight of the liquid, reducing the possibility of liquid leakage into the gutter. The offset that has shown promising results is between about 0.030" or about 0.7 mm and about 0.25" or about 6 mm. This design results in the lower chemical head 120 to be wider than the upper chemical wall 110.

Figure 2:
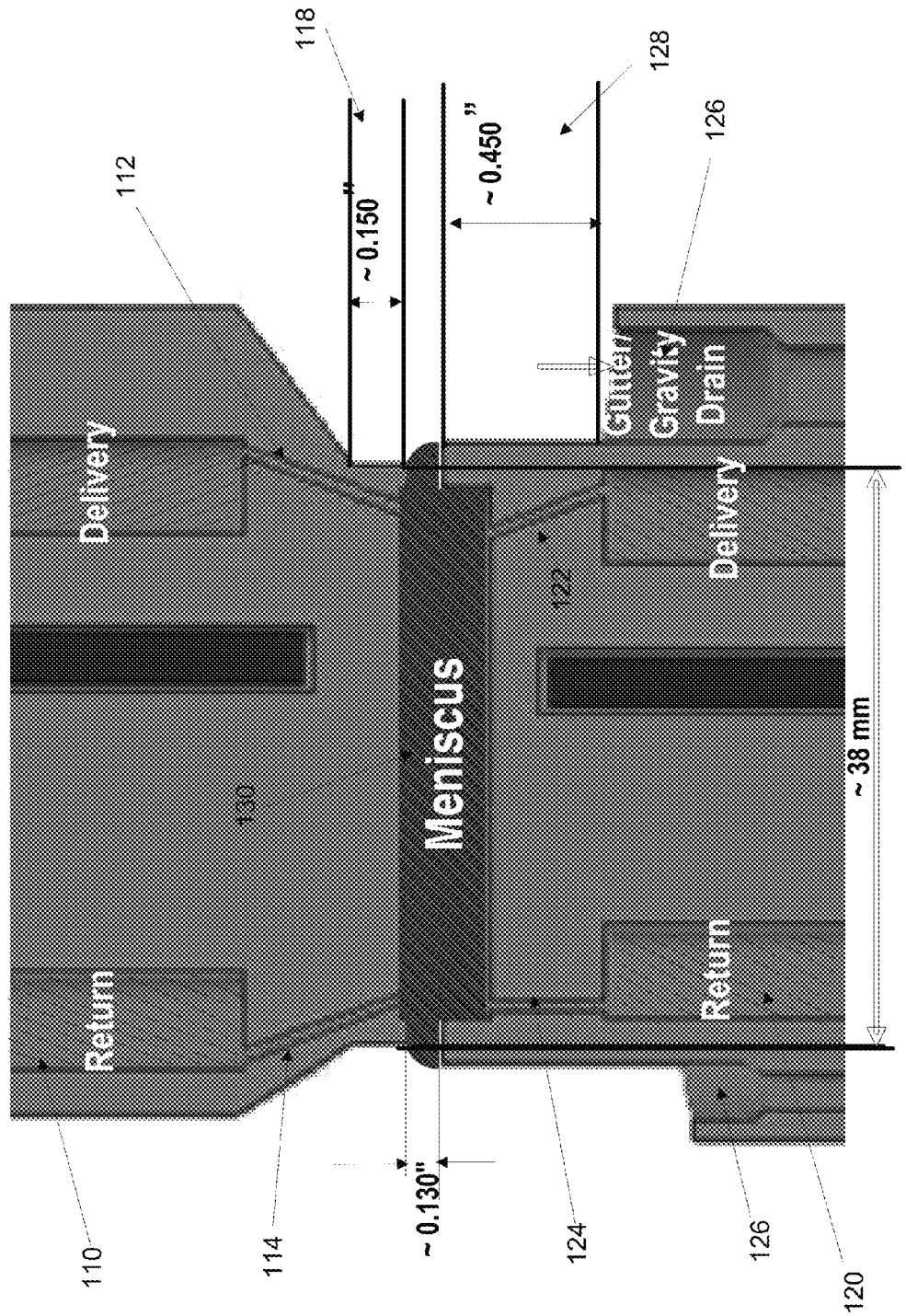
FIG. 2 illustrates a cross-sectional view of various components of the confinement chemical head used in confining the liquid meniscus, in another embodiment of the invention.

FIG. 2 illustrates the various component features and offset measurements of exemplary chemical heads, 110, 120, that have shown promising results in physical confinement of a liquid meniscus applied over a wafer, in one embodiment of the invention. A pocket of meniscus 130 is formed between a first chemical head 110 and a second chemical head 120. The meniscus pocket 130 covers at least a portion of the wafer when the wafer moves under the chemical heads 110, 120. The width of meniscus pocket can vary with the geometry of the chemical heads, 110, 120. In one embodiment, the pocket of meniscus defined by the chemical heads may cover the width of the wafer. In another embodiment, the meniscus pocket may cover only a portion of the top and bottom surface of the substrate. In the embodiment illustrated in FIG. 2, the width of the meniscus pocket is about 38 mm. A step 118, 128, is defined along at least a portion of an outer periphery of the meniscus pocket 130 at a leading edge of each of the first and second chemical heads 110, 120. The height of the step is defined empirically and is sufficient to preserve the containment characteristic of the liquid chemistry in the meniscus.

In another embodiment, the height of the step wall outside the meniscus confinement region depends on the operational pressure of the meniscus confined therein. The operational pressure of the meniscus, in turn, may depend on one or more parameters including geometry of the chemical heads, proximity of the chemical heads to the surface of the wafer, and the liquid chemistry flow, among other parameter constraints. Using a meniscus width of about 2 cm, a chemical head to wafer gap between about 0.3 mm and about 2 mm with an optimum wafer gap of about 1 mm; and a liquid chemistry flow between about 0.5 liters/min and about 3 liters/min, the height of the step outside the meniscus region to successfully confine the meniscus was required to be larger than about 0.3 mm. The head-to-head gap is dictated by the head-to-wafer gap and the wafer and carrier thickness. The head-to-head gap that has shown promising results is between about 2.3 mm and 5 mm with an operational gap of about 3 mm. Additionally, it is found that optimal confinement of the meniscus is possible when the minimum height of the step 118, 128, outside the meniscus region is about 3 mm. Based on the operating constraints, it is determined that the optimal containment is achieved when the height of the step wall outside the meniscus pocket 130 is about 0.150 inches or about 3.75 mm. The operational gap defined by the gap between the step feature of the first and the second chemical heads that have shown promising results is about 3 mm. Operational gap depends on surface energy which is a function of the liquid chemistry composition and temperature of the liquid chemistry when applied to the wafer.

Angled inlet conduits 112, 122, are defined in the chemical heads 110, 120, and are located just inside an outer edge of the pocket of meniscus 130 close to the step, in one embodiment. Variation in configuration and location of the inlet conduits has been discussed extensively with reference to FIG. 1. The angled inlet conduits are spaced apart from a step wall and configured to deliver the liquid chemistry into the meniscus pocket 130 in a single phase. In one embodiment, the inlet conduits 112, 122, are angled at about 20° to the meniscus plane normal. The angled delivery provides the momentum to move the liquid chemistry away from the step wall thereby ensuring that the containment characteristics of the meniscus are substantially preserved. By defining the inlet conduits to be close to the walls of the step 118, 128, the meniscus confinement boundary can be established as close to the pocket boundary as possible. Thus, the meniscus boundary is defined by the physical confinement walls. The delivery and inner return conduits are spaced so as to maximize the volume where the liquid chemical re-circulates to maintain a uniform composition of the liquid. Walls of the step 118, 128, adjacent to the pocket of meniscus are offset from each other such that the step 128 of the lower chemical head is extended outward of the meniscus with respect to the wall of the step 118 of the upper chemical head. An optimal offset between the walls of the steps, 118, 128, is between about 0.8 mm to about 6 mm with an optimal offset at about 0.05" or about 1.25 mm. It should be noted that due to the offset, the lower chemical head is physically wider than the upper chemical head. A gutter 126 is defined at both the leading edge and trailing edge of the lower head 120 to receive an overflow of liquid chemistry applied to the wafer.

In one embodiment, additional inlet conduits may be provided to introduce the liquid chemistry into the pocket of meniscus for application to the portion of the surface of the wafer 100 exposed to the meniscus. The additional inlet conduits may be positioned anywhere inside the confined meniscus boundary. Since the additional inlet conduits are located inside the boundary of the meniscus and not at the leading or trailing edge, the conduits need not have to be angled. Instead, the conduits may be disposed normal to the plane of the meniscus so that the liquid chemistry may be introduced directly into the liquid bulk in a single phase. An exemplary additional inlet conduit 112-a is shown in FIG. 2A, which illustrates an alternate embodiment of the chemical head used in delivering liquid chemistry to the surface of the substrate 100. The momentum of the liquid chemistry delivery flow is in line with the flow of the liquid chemistry within the meniscus thereby maintaining the meniscus confinement wall.

An inner return conduit is defined at each of the upper chemical head 110 and lower chemical head 120. The inner return conduits, 114, 124, are located at the trailing edge of the chemical heads 110, 120 and are located within the meniscus pocket 130 so that the liquid chemistry may be removed in a single phase. The inner return conduits may be angled (inner return conduit 114) or straight (inner return conduit 124) as illustrated in FIG. 2. In another embodiment, multiple inner return conduits are defined at each of the upper chemical head 110 and lower chemical head 120. The multiple inner return conduits are located within the meniscus pocket 130 so that the liquid chemistry is removed in a single phase. FIG. 2A illustrates one such embodiment where two rows of inner return conduits are present. The meniscus pocket formed in the lower chemical head 120 may be extra deep to avoid any left over and stagnant liquid chemistry from wetting the carrier transporting the wafer. In one embodiment the depth of the meniscus pocket in the lower chemical head 120 that has shown promising results is about 0.130" or about 3.25 mm.

Using a single phase delivery and single phase return, air flow is eliminated from the delivery network and with it the disadvantages associated with the air flow. One of the disadvantages associated with air flow includes uncontrolled evaporation. Uncontrolled evaporation results in substantial liquid chemistry loss. As some of the liquid chemistry used in the cleaning process are expensive, the liquid chemistry loss adds to the cost of cleaning the wafer. The other disadvantage is the introduction of bubbles into the liquid medium which may result in cavitation. Uncontrolled cavitation may damage the features formed on the wafer making the use of air flow very undesirable. Other disadvantages of air bubbles in the delivery include non uniform chemical exposure as the air bubbles can locate themselves at the wafer-liquid interface, impeding the wetting of the wafer surface by the liquid chemical and drying problem including high particle count and particle streaking as the uncontrolled 3-phase (solid (wafer)-liquid-air) interface can introduce drying marks.

Figure 3:
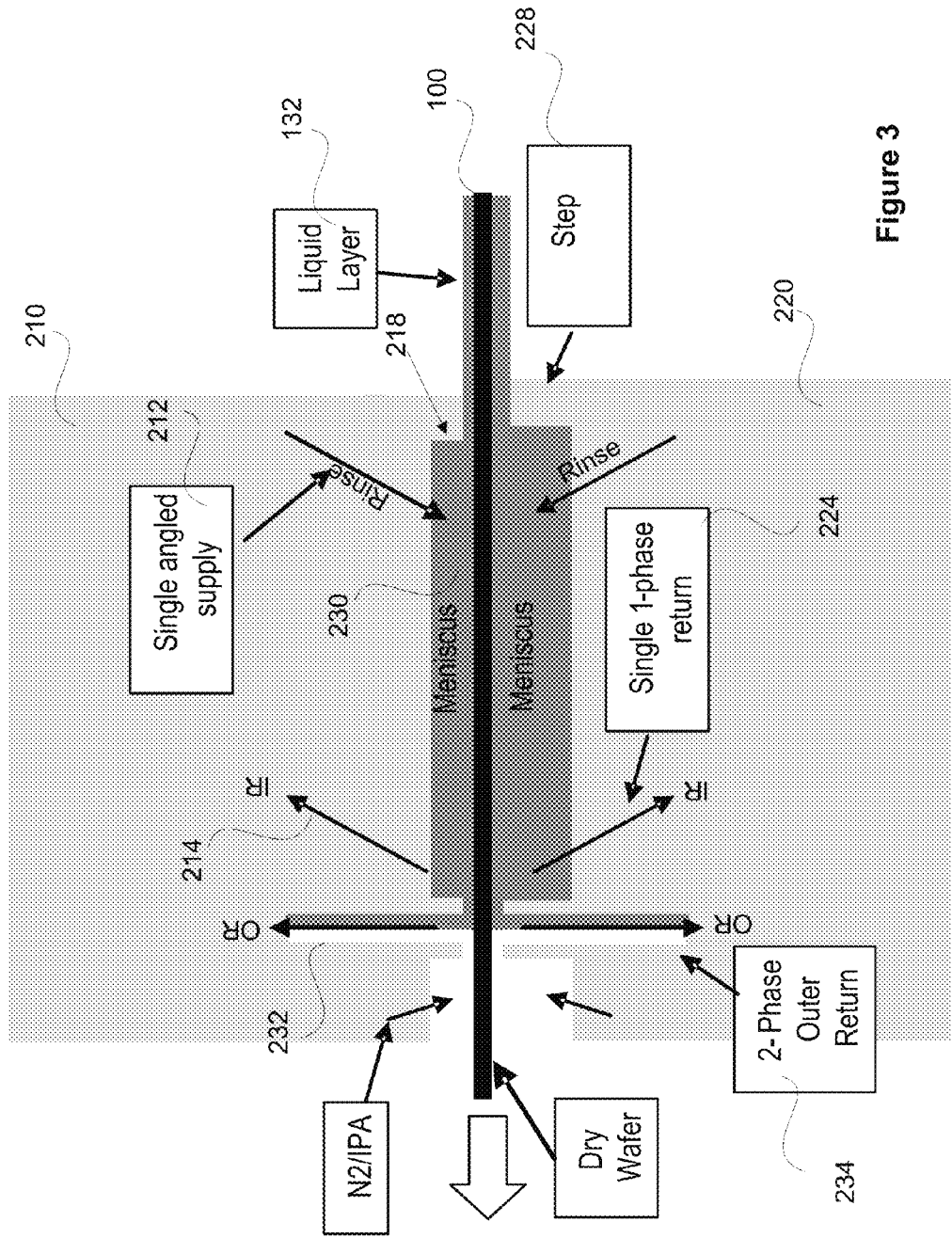
FIG. 3 illustrates a cross-sectional view of a simplified rinse head used in providing physical confinement of a liquid meniscus disposed over a semiconductor wafer, in one embodiment of the invention.

In addition to the first and second chemical heads, rinse heads may be used to rinse the surface of the wafer after a chemical clean. FIG. 3 illustrates a side view of a simplified block diagram of a pair of rinse heads used in rinsing the wafer after the chemical clean. After the chemical clean, the wafer is moved under a first rinse head 210 and a second rinse head 220. As the wafer 100 is moved from under the chemical heads, 110, 120, to under the rinse heads 210, 220, the wafer 100 is covered by a layer of liquid chemistry 132 that is left over from the chemical clean. The rinse heads 210, 220 are disposed to cover at least a portion of a top side and an underside of the wafer surface and define a pocket of meniscus 230 over at least a portion of the wafer 100. A portion of the meniscus pocket 230 defined by the second rinse head 220 may be deeper than the one defined by the fist rinse head 210. This is to provide the physical confinement of the rinsing chemical meniscus so that the characteristics of the meniscus are substantially preserved.

In one embodiment, the rinse heads are equipped with angled inlet conduits, 212, 222, that are configured to introduce a rinsing chemistry into the meniscus pocket 230. The angled inlet conduits are located at a leading edge of the first and second rinse heads, 210, 220, and within the periphery of the meniscus pocket 230 so as to introduce the rinsing chemistry in a single phase directly into the meniscus pocket 230. In an alternate embodiment, in addition to the angled inlet conduits, the rinse heads may include additional inlet conduits 212-*a* disposed within the meniscus pocket. As these additional inlet conduits 212-*a* are disposed inside the meniscus pocket, they need not have to be provided at an angle. Instead, they are provided normal to the plane of the meniscus within the meniscus pocket. An exemplary rinse head with the additional inlet conduit, 212-*a*, disposed normal to the plane of the meniscus is illustrated in FIG. 3A. A step (218, 228), similar to the one described with reference to the chemical heads, is defined in each of the first and second rinse heads, 210, 220. The steps, 218, 228, are defined along at least a portion of an outer periphery of the meniscus pocket 230 at a leading edge of the rinse heads 210, 220. The step provides the physical confinement of the meniscus within the boundaries of the meniscus pocket 230 defined between the rinse heads. The height of a wall of the step in each of the rinse heads, 210, 220, is configured to ensure that the characteristics of the meniscus are substantially preserved. The walls of the steps, 218, 228, adjacent to the meniscus pocket 230 at the first and second rinse heads are offset such that the wall of the step 228 at the lower rinse head 220 is disposed outward of the meniscus in relation to the wall of the step 218 at the upper rinse head 210. This is to counterbalance any asymmetry of meniscus internal pressure found within the meniscus in the meniscus pocket 230. In one embodiment, the offset between the walls of the steps at the lower head and the upper head is similar to the ones discussed with reference to chemical heads of FIG. 1.

An inner return conduit is defined at each of the rinse heads, 210, 220, to remove the rinsing chemistry during a rinsing cycle, in one embodiment. The inner return conduits, 214, 224, are located at the trailing edge of the rinse heads within the pocket of meniscus 230 so that the rinsing chemistry may be removed in a single phase. The inner return conduits, 214, 224, may be disposed angularly or may be disposed straight. In another embodiment, multiple inner return conduits are provided at each of the rinse heads, 210, 220, to remove the rinsing chemistry. FIG. 3A illustrates one such example with two inner returns. The inner return conduits need not be located at the trailing edge but can be located anywhere within the meniscus pocket after the inlet conduits so as to ensure removal of rinsing chemistry in a single phase. In addition to the inner return conduits, 214, 224, that enable single phase returns, the rinse heads, 210, 220, may include outer return conduits, 232, 234, disposed at the periphery of the meniscus pocket 230 so that the rinsing chemistry may be removed in two-phase. The meniscus near the two phase outer return conduits, 232, 234, may be exposed to either ambient air or to other chemicals applied to the wafer surface. In one embodiment, a flow of Nitrogen and/or IsoPropyl Alcohol (IPA) vapor may be introduced at the periphery of the meniscus pocket 230. The Nitrogen/IPA vapor may be introduced during a drying cycle and may act as drying agent to dry the wafer after a rinsing cycle. The outer return conduits, 232, 234, remove the rinsing chemistry along with the Nitrogen/IPA vapors in two phase after the rinsing/drying cycle.

Figure 4:
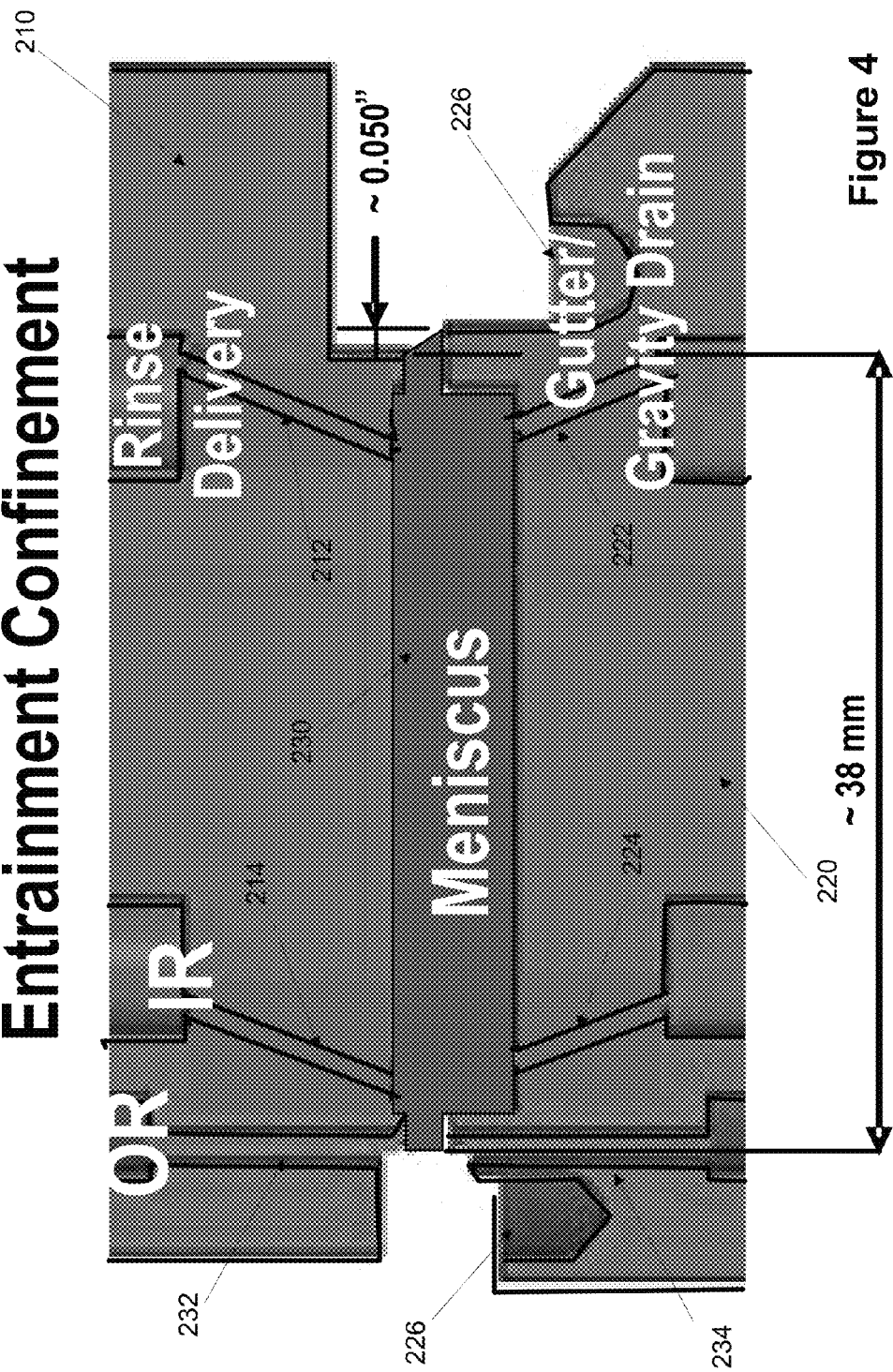
FIG. 4 illustrates a cross-sectional view of various components of the confinement rinse head used in providing physical confinement of a liquid meniscus disposed over a semiconductor wafer, in one embodiment of the invention.

In one embodiment, the lower rinse head 220 may also include a gravity drain 226 along a leading edge. FIG. 4 illustrates various component features that are used in the physical confinement of a liquid meniscus at the wafer surface. As shown in FIG. 4, the gravity drain 226 may be used to collect any rinsing chemistry and liquid chemistry that may flow out of the meniscus pocket 230 during the rinsing process. The functionality of the gravity drain 226 in the rinse head is similar in nature to the gravity drain 126 provided in the chemical head of FIGS. 1 and 2. The location of the gravity drain 226 is exemplary and should not be construed restrictive. As a result, in addition to the gravity drain 226 in the leading edge, a second gravity drain may be provided at the trailing edge of the lower rinse head 220 to collect the rinsing chemistry. The wafer moves through the rinse heads 210, 220, and emerges substantially clean, free of chemical and dry.

The chemical heads described in the aforementioned embodiments enables application of chemistries up to at least about 70° C. Liquid chemistries are often applied at temperatures that are generally above room temperatures. Conventional chemical heads that are used in the chemical clean cannot operate at temperatures above room temperature due to deformation caused by the static temperature gradient that naturally develops during the application of the chemistries at higher temperature. On the other hand, chemical heads used in the present embodiments are able to overcome the static temperature gradient for a more efficient clean, thereby making this a more efficient design.

The embodiments of the invention are not restricted to a system of chemical heads which are used to dispense and remove liquid chemistry and rinse heads that are used to dispense and remove rinsing chemistry. In an alternate embodiment of the invention, a drying head may be used in addition to the chemical heads and rinse heads. The drying head is similar in structure to the rinse head 210 and is used to remove any liquid chemistry left behind on the surface of the substrate from prior operations, such as cleaning and rinsing. In an alternate embodiment of the invention, the drying head may be used in place of the rinse head during cleaning of the substrate surface. In yet another embodiment, the system for physically confining a liquid meniscus applied at a wafer surface includes a chemical head paired with a traditional air entrainment rinse head. The chemical head provides the cleaning chemistry for cleaning the substrate and the rinse head enables rinsing the substrate after the cleaning operation. As can be seen, various components can be used in various configurations to physically confine the liquid meniscus applied to the wafer (substrate) surface. The embodiments described herein are exemplary and should not be considered restrictive. Other configurations with the various components are feasible.

Figure 7:
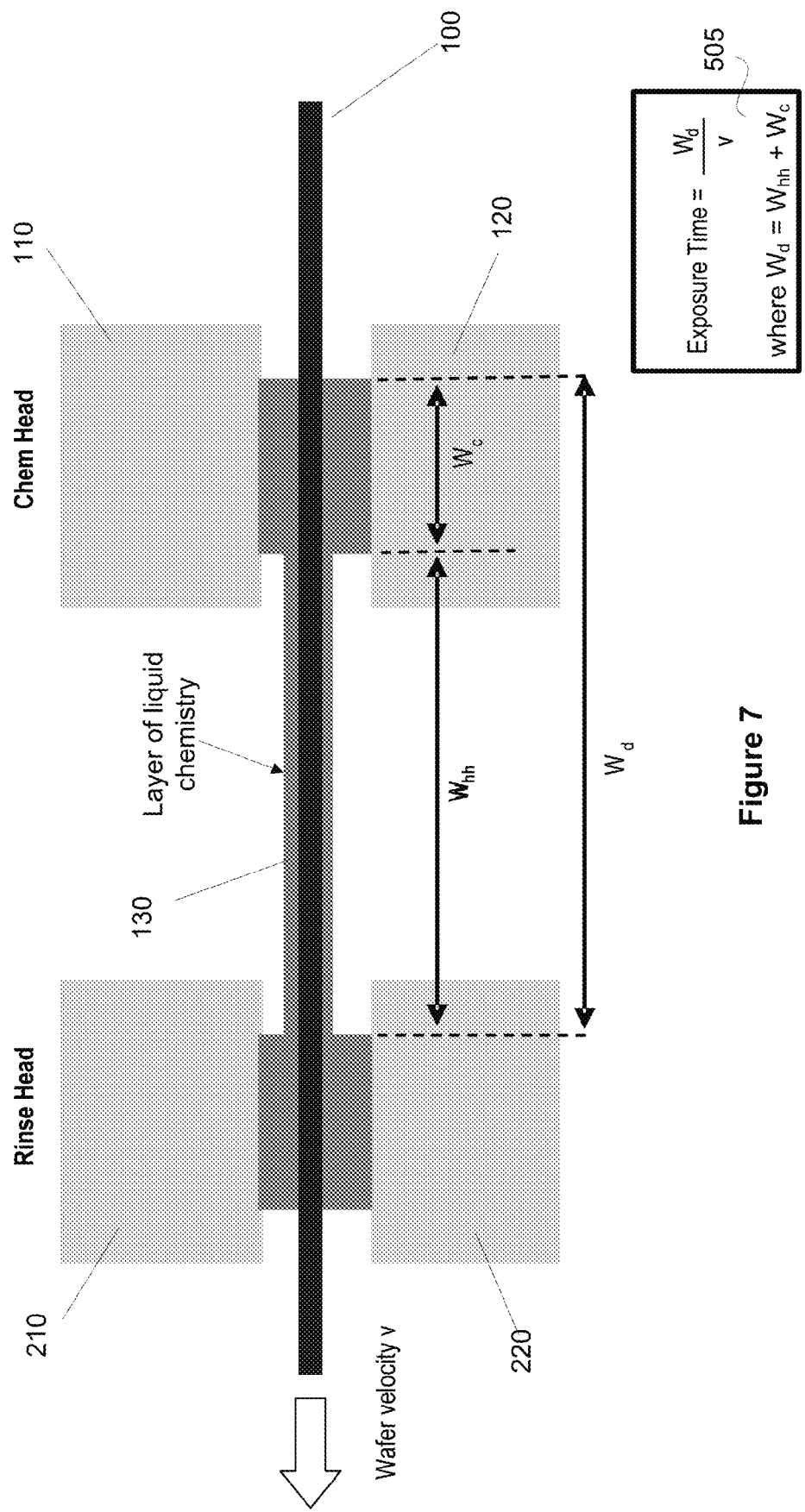
FIG. 7 illustrates a simplified block diagram of a system for physically confining a liquid meniscus applied over a semiconductor wafer, in one embodiment of the invention.

FIG. 7 illustrates a system for physically confining a liquid meniscus applied at a wafer surface, in one embodiment of the invention. The system includes a pair of chemical heads, 110, 120, to clean the wafer after a fabrication operation and a pair of rinse heads, 210, 220, to rinse the wafer after the chemical clean. The number of pairs and orientation of the chemical heads, 110, 120, and rinse heads 210, 220, are exemplary and should not be considered restrictive. Any number of pairs of chemical heads and rinse heads may be used in any orientation so long as the functionality of the invention is maintained. The components of the chemical heads and rinse heads in the system are similar to the ones that have been described earlier with reference to FIGS. 2-5. The system includes a wafer carrier mechanism that receives, holds and transports the wafer along a plane. The carrier mechanism can be any carrier mechanism that is well known in the art or any other carrier mechanism that provides the functionality of the current carrier mechanism. The first and second chemical heads are disposed to cover at least a portion of a top and an underside of the wafer as the wafer moves along the axis. The first and second chemical heads define a pocket of meniscus into which liquid chemistry may be delivered during chemical clean. The pocket of meniscus provides a layer of meniscus to cover the portion of the top and underside of the wafer exposed to the first and second chemical heads as the wafer moves through the pocket of meniscus under the chemical heads.

Angled inlet conduits are provided at the leading edge of the first and second chemical heads inside a periphery of the meniscus pocket so as to introduce the liquid chemistry into the meniscus pocket in a single phase. Inner return conduits are provided at the trailing edge of the chemical heads so as to remove the liquid chemistry in a single phase. It should be noted that the location of the inlet conduits and inner return conduits is exemplary and should not be considered restrictive. The inlet conduits and inner return conduits can be located anywhere within the meniscus pocket so long as they maintain the respective functionality. A step is defined along at least a portion of an outer periphery of the meniscus pocket to act as a physical barrier for the meniscus substantially confining the meniscus within the pocket. The height of the step is defined such that it is sufficient to preserve the confinement characteristics of the meniscus. Walls of the steps adjacent to the meniscus pocket in the first and second chemical heads are configured such that the wall of the step in the lower head is extended outward with respect to the wall of the step in the upper head to counterbalance any asymmetry associated with the internal pressure of the meniscus. One or more gravity drains are disposed at any one of the leading edge, trailing edge or both the leading edge and trailing edge of the chemical heads to capture the liquid chemistry that spills out of the meniscus pocket. The captured liquid medium can be reused during the current cleaning or subsequent cleaning process.

The rinse heads, 210, 220, are similar in structure to the chemical heads except that the rinse heads are configured to deliver a rinsing chemistry into the meniscus pocket. The rinse heads include angled inlet conduits, inner return conduits, gravity drains at the leading and/or trailing edge of the rinse heads, steps formed along one or more walls of the meniscus pocket to confine the meniscus within. In addition to the aforementioned components, the rinse heads include an outer return conduit at the outer periphery of the meniscus pocket. The outer return conduit enables collection of the rinsing chemistry in two phase. The rinsing chemistry at the outer periphery of the meniscus pocket near the outer return conduit may be exposed to ambient air or other chemical applied to the surface of the wafer. The rinsing chemistry together with the other chemical is removed by the outer return conduit. In this embodiment, the returned rinsing chemistry cannot be reused as it may have mixed with the other chemicals resulting in change of chemical composition. As a result, the rinsing chemistry collected by the outer return conduit will be discarded. In one embodiment, the rinse heads may be configured to perform a drying operation by applying a drying agent, such as Nitrogen and/or Isopropyl Alcohol (IPA) to the surface of the wafer after the rinsing operation in order to substantially dry the wafer. The outer return conduit removes the drying agent and the rinsing chemistry after the rinsing and drying operations.

It should be noted that the carrier moves the wafer slowly through the system so that the surface of the wafer may be sufficiently exposed to the various chemistries for a substantial cleaning of the wafer. As the wafer moves through the chemical heads, the wafer experiences focused cleaning by the confined liquid chemistry. As the wafer emerges out from under the chemical heads, a layer of liquid chemistry may be left on the wafer surface. The layer may be left behind to prevent other contaminants from adhering to the wafer surface, to prevent premature drying or for any other reasons. As the wafer moves through and emerges out from under the rinse heads, the liquid chemistry is removed along with any other remnant chemicals. When the rinse heads are configured to provide drying agents, the emerging wafer is substantially dry. The exposure time for the wafer under each of the chemical and rinse heads for optimal cleaning and drying may depend on the amount of contaminants and level of clean desired. In one embodiment, the exposure time is defined as a function of the width of the pocket of meniscus+the distance between the chemical and rinse menisci and the wafer velocity, as shown as element 505 in FIG. 7. The width of the meniscus, the distance between the chemical and the rinse menisci and the wafer velocity may be adjusted so as to provide an optimally clean wafer.

In one embodiment, the rinse heads may be integrated with the chemical heads. In this embodiment, the chemical heads may be configured to keep the liquid chemistry meniscus distinct from the rinsing chemistry meniscus so as to allow liquid chemistry reclaim. The reclaimed liquid chemistry may be reused during current cleaning or in subsequent cleaning process, thus making optimal use of expensive liquid chemistry. In another embodiment, the rinse heads may be kept distinct from the chemical heads. By keeping the chemical heads and rinse heads distinct, it is possible to apply the liquid chemistry using operating constraints that may be different from the operating constraints of the rinsing chemistry. For instance, the wafer may be treated to a hot liquid chemistry and cold rinse chemistry. Additionally, by keeping the rinse heads distinct from the chemical heads, any configuration changes to the chemical or rinse heads may be individually attained without affecting the other heads' configuration. The aforementioned embodiments provide for a substantial confinement of a liquid meniscus so that a more focused wafer clean operation can be achieved.

Figure 8:
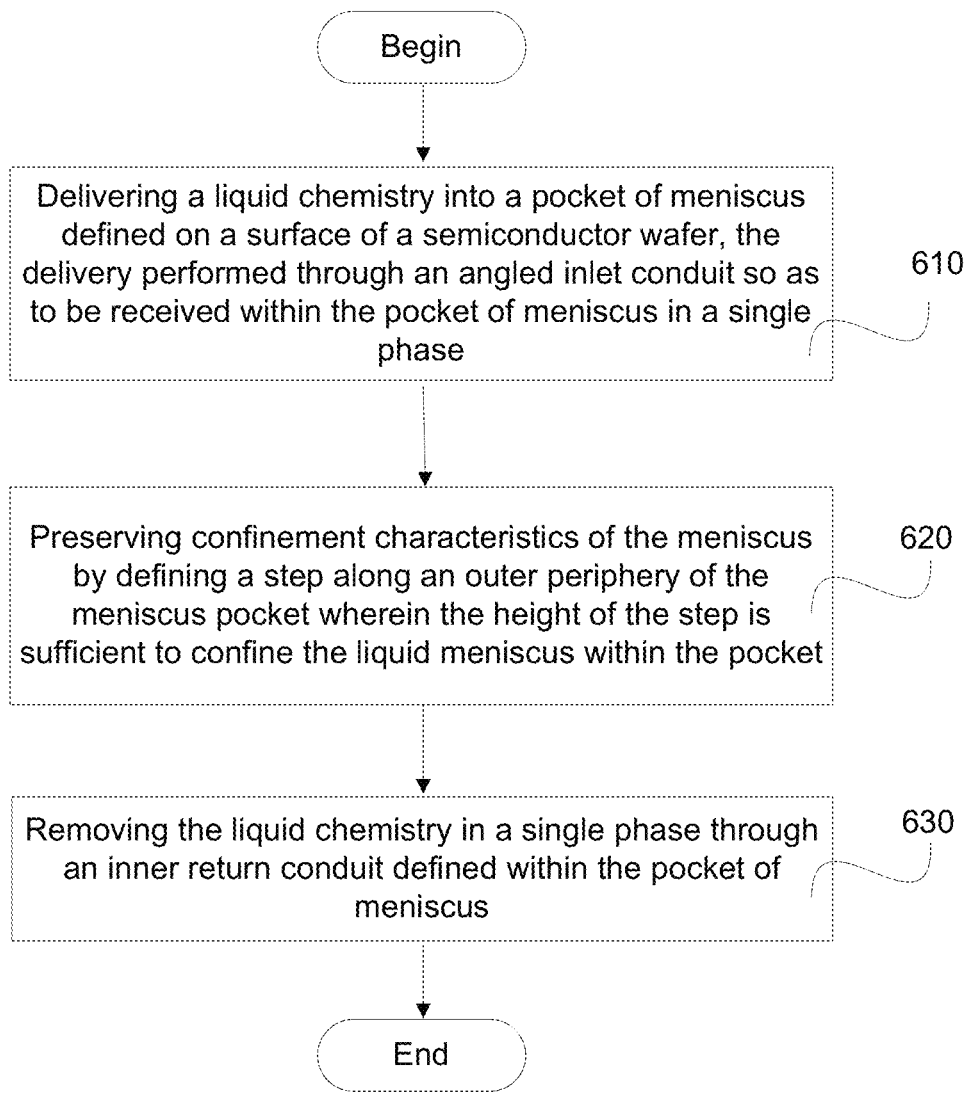
FIG. 8 illustrates a flow chart of operations for physically confining a liquid meniscus applied over a semiconductor wafer, in one embodiment of the invention.

With the above detailed description of the various embodiments, a method for physically confining a meniscus of liquid medium applied over a wafer will now be discussed with reference to FIG. 8. FIG. 8 illustrates various operations involved in physical confinement of a meniscus of liquid medium, in one embodiment of the invention. The method begins at operation 610 wherein a liquid chemistry is applied to a semiconductor wafer through inlet conduits. A pocket of meniscus is defined by a pair of chemical heads to substantially cover at least a portion of a top and underside surface of a wafer that is moving under the chemical heads. An angled inlet conduit is defined at the leading edge of the chemical heads within a periphery of the meniscus pocket to enable introduction of the liquid chemistry into the meniscus pocket in a single phase. The confinement characteristics of the liquid chemistry meniscus is preserved by a step defined along a leading edge covering at least a portion of an outer periphery of the meniscus pocket, as illustrated in operation 620. The height of the step outside of the meniscus pocket is defined based on one or more operating constraints associated with the liquid medium and the chemical heads so that the confinement characteristics of the liquid medium are preserved. Additionally, walls of the step in the chemical heads are designed such that the wall of the step of the lower chemical head is extended outward of the meniscus in relation to the wall of the step of the upper chemical head so as to counterbalance any asymmetry in the meniscus internal pressure. The portion of the surface of the wafer covered by the meniscus pocket is sufficiently exposed to the liquid chemistry for an optimal clean and the liquid chemistry is removed through inner return conduits in a single phase, as illustrated in operation 630. The inner return conduits are defined at a trailing edge of the chemical heads within the pocket of meniscus so that the liquid medium may be returned in single phase. By providing single phase delivery and return for the liquid medium, the liquid medium can be reused in subsequent cleaning operations thereby making optimal use of the liquid medium. The process of introducing the liquid chemistry in single phase, preserving the confinement characteristics and removing the liquid chemistry in single phase may be continued for subsequent wafers.

Figure 9:
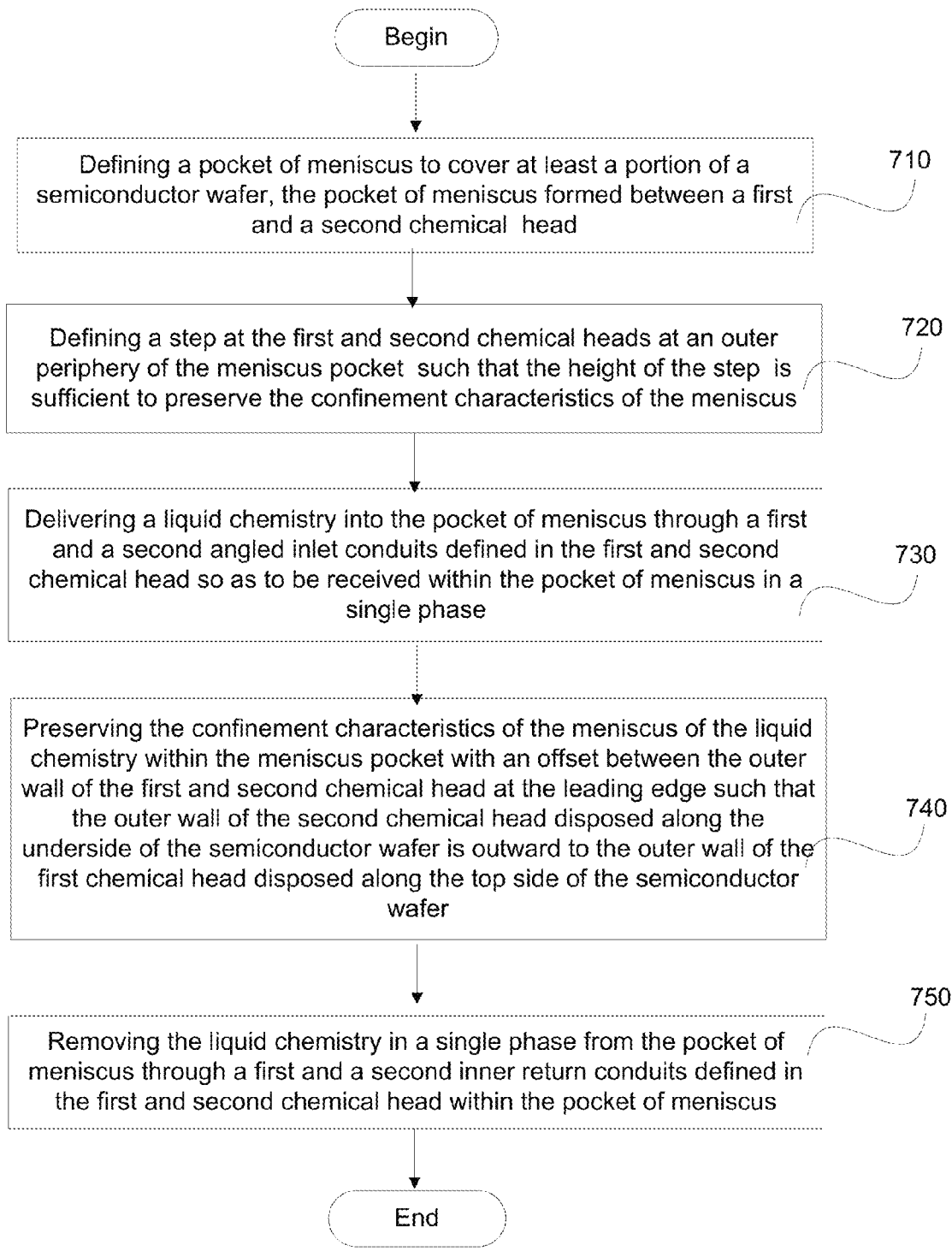
FIG. 9 illustrates a flow chart of operations for physically confining a liquid meniscus applied over a semiconductor wafer, in an alternate embodiment of the invention.

FIG. 9 illustrates process operations for confining liquid chemistry meniscus applied over a surface of a wafer, in an alternate embodiment of the invention. The process begins with defining a pocket of meniscus between a first and second chemical heads, as illustrated in operation 710. The meniscus pocket is defined to cover at least a portion of a top and underside surface of a semiconductor wafer moving under the first and second chemical heads. The width of the meniscus pocket may be defined based on the geometry of the chemical heads. A step is defined at a leading edge of the first and second chemical heads along an outer periphery of the meniscus pocket so as to cover at least a portion of the meniscus pocket, as illustrated in operation 720. The step may cover the meniscus pocket partially or completely. The height of an outer wall of the step adjoining the meniscus pocket is defined to be at least at a threshold value. The threshold value may be defined as a function of one or more operating constraints associated with the chemical heads and the liquid chemistry applied to the surface of the wafer. The liquid chemistry is selected and applied to the wafer surface through inlet conduits defined in the first and second chemical heads, as illustrated in operation 730. The type and operating constraints associated with the liquid chemistry are selected based on a type, size, physical and chemical characteristics of contaminants that need to be removed and the characteristics of the wafer including the characteristics of the features formed on the wafer over which the liquid chemistry is applied. The inlet conduits are formed inside a periphery of the meniscus pocket and angled inwards away from the outer wall of the meniscus pocket so that the liquid medium can be introduced into the pocket of meniscus in a single phase. When the liquid medium is applied at an angle, the momentum of the liquid medium will make the liquid medium to flow away from the outer wall of the step, thereby substantially confining the liquid medium meniscus. The liquid medium meniscus is further confined by an offset in the steps of the first and second chemical heads, as illustrated in operation 740. The outer walls of the steps are offset such that the wall of the step of the second chemical head disposed on the underside of the wafer is extended outwards in relation to the wall of the step of the first chemical head disposed on the top side of the wafer. This is to counterbalance any asymmetry associated with internal meniscus pressure.

After sufficient exposure of the wafer surface to the liquid chemistry, the liquid chemistry is removed in a single phase through inner return conduits, as illustrated in operation 750. The amount of exposure of the wafer surface is defined by exposure time. The exposure time is defined as a function of the wafer carrier velocity and the width of the meniscus pocket+the distance between the chemical and rinse menisci, as illustrated with reference to FIG. 7. The inner return conduits are defined at the first and second chemical heads within the inner periphery of the meniscus pocket so that the liquid chemistry may be returned in single phase. As mentioned earlier, the inner return conduits may be located anywhere within the meniscus pocket. The process of applying the liquid chemistry in single phase, preserving the confinement characteristics of the liquid chemistry meniscus during the cleaning process and removal of the liquid chemistry in single phase can be repeated for subsequent wafer cleans.

As can be seen, providing a single phase delivery, single phase return and maintaining the meniscus characteristics during chemical clean, optimal clean is achieved while ensuring optimal use of the costly liquid chemistry. The embodiments avoid the use of air flow thereby preventing uncontrolled evaporation and subsequent loss of liquid chemistry.

For more information on proximity heads, orientation and configuration of proximity heads, configuration and functions of arm assembly, and transducers within proximity heads for cleaning using acoustic energy, reference can be made to U.S. application Ser. No. 10/611,140 filed on Jun. 30, 2003, entitled "METHOD AND APPARATUS FOR CLEANING A SUBSTRATE USING MEGASONIC POWER" and assigned to the assignee of the current application, which is incorporated herein by reference.

Exemplary proximity heads and their respective configurations and patterns of the inlet conduits as well as the outlet conduits may be seen in U.S. patent applications Ser. Nos. 10/261,839, 10/404,270, and 10/330,897 which have been incorporated herein by reference. Therefore, any, some, or all of the proximity heads described herein may be utilized in any suitable configuration for suitable substrate cleaning and drying. In addition, the proximity head may also have any suitable numbers or shapes of outlet conduits and inlet conduits.

For more information on the viscoelastic material used for cleaning the substrate, reference can be made to U.S. Provisional Application No. 61/013,950 filed on Dec. 14, 2007, entitled "MATERIALS AND METHODS FOR PARTICLE REMOVAL BY SINGLE-PHASE AND TWO-PHASE MEDIA," assigned to the assignee of the instant application, which is incorporated herein by reference.

The liquid chemistry may be a two-phase (solid-liquid) chemical or a chemistry that is applied using an Advanced Mechanical Clean (AMC) technique. Some of the liquid chemistry that have been used include Hydrofluoric acid (HF), Hydrochloric acid (HCL), Sulfuric acid ($H_2SO_4$), Ammonium Hydroxide ($NH_4OH$), Hydrogen peroxide ($H_2O_2$). Some of the common clean chemistries are called Diluted Sulfuric acid and Peroxide (DSP), DSP with added HF (DSP+), Sulfuric acid and Peroxide Mixture (SPM), Standard Clean 1 (SC1), Standard Clean 2 (SC2), Ammonium Peroxide Mixture (APM). Proprietary aqueous based clean solutions are also used. For more details about the liquid and cleaning chemistry, reference can be made to U.S. patent application Ser. No. 11/532,491, filed on Sep. 15, 2006, entitled "METHOD AND MATERIAL FOR CLEANING A SUBSTRATE", which is incorporated herein by reference.

While this invention has been described in terms of several preferred embodiments, it will be appreciated that those skilled in the art upon reading the preceding specifications and studying the drawings will realize various alterations, additions, permutations and equivalents thereof. It is therefore intended that the present invention includes all such alterations, additions, permutations, and equivalents as fall within the true spirit and scope of the invention.

What is claimed is:

1. An apparatus for physically confining a liquid meniscus over a semiconductor wafer, comprising:
   a first and a second chemical head disposed to cover at least a portion of a top and an underside surface of the semiconductor wafer, each of the first and the second chemical heads comprising:
   an angled inlet conduit at a leading edge to deliver liquid chemistry into a pocket of meniscus in a single phase, the pocket of meniscus defined over the portion of the top and the underside surface of the semiconductor wafer covered by the first and the second chemical heads so as to contain the liquid chemistry applied to the surface of the semiconductor wafer as a meniscus;
   an inner return conduit located within the pocket of meniscus at a trailing edge of the first and the second chemical heads so as to remove the liquid chemistry from the surface of the semiconductor wafer in a single phase; and
   a step formed along at least a portion of an outer periphery of the pocket of meniscus at the leading edge of the first and the second chemical heads so as to substantially confine the meniscus of the liquid chemistry within the pocket of meniscus, the step having a height that is sufficient to preserve confinement characteristic of the meniscus,
   wherein the inlet conduit is spaced apart from the step and wherein the first chemical head and the second chemical head are misaligned such that a wall of the step adjoining the pocket in the second chemical head disposed on the underside of the semiconductor wafer when present, is extended outward in relation to a wall of the step adjoining the pocket in the first chemical head disposed on the top of the semiconductor wafer.

2. The apparatus of claim 1, wherein the step is defined to encircle the pocket confining the liquid chemistry within the pocket.

3. The apparatus of claim 1, wherein the misalignment of the walls of the step of the first head and the second head is between about 0.7 mm to about 6 mm.

4. The apparatus of claim 1, wherein the second head disposed on the underside is configured to provide a pocket of meniscus of the liquid chemistry.

5. The apparatus of claim 1, further including a gutter at the second head disposed at the underside, the gutter is formed at the leading edge of the second head and is configured to reclaim the liquid chemistry that overflows from the pocket on the surface of the semiconductor wafer.

6. The apparatus of claim 1, wherein the surface between the angled inlet conduit and inner return conduit of the first head disposed at the top of the semiconductor wafer when present, is patterned so as to enhance wetting by the liquid chemistry.

7. The apparatus of claim 1, further includes a first and a second rinse head, the first and second rinse heads comprising,
   angled inlet conduit located within the pocket at a leading edge of the first and the second rinse heads and configured to deliver a rinsing chemistry into the pocket, the pocket defined to cover at least a portion of the top and underside surface of the semiconductor wafer when present;
   inner return conduit located within the pocket at a trailing edge of the first and the second rinse heads so as to remove the rinsing chemistry from the surface of the wafer; and
   a step formed along at least a portion of the outer periphery of the pocket at the leading edge of the first and second rinse heads so as to substantially confine the meniscus of the rinse chemistry within the pocket,
   wherein the inlet conduit is spaced apart from the step and defined adjacent to the inner wall of the step.

8. The apparatus of claim 7, wherein each of the first and the second rinse heads further include an outer return conduit formed at the outer periphery of the pocket at the trailing edge of the first and the second rinse heads, the outer return conduit enabling removal of the rinsing chemistry.

9. The apparatus of claim 7, wherein the first and the second rinse heads are further configured to deliver a drying chemistry to substantially dry the semiconductor wafer, when present, after a successful rinse.

10. The apparatus of claim 1, wherein the height of the step is computed as a function of one or more operating constraints of the liquid chemistry within the pocket, wherein the operating constraints are dynamic.

11. The apparatus of claim 10, wherein the operating constraints include one or more of pressure, temperature, flow rate, chemical composition and activation energy of the liquid chemistry.

12. A system for physically confining a meniscus of a liquid medium applied over a semiconductor wafer, comprising:

a carrier mechanism to receive, support and transport the semiconductor wafer along an axis;

a first and a second chemical head disposed to cover at least a portion of a top and an underside surface of the semiconductor wafer when present, the first and second chemical heads defining a pocket of meniscus to receive a first liquid medium applied by the first and the second chemical heads during chemical clean, a first and a second rinse head disposed to cover at least a portion of the top and the underside surface of the semiconductor wafer, the first and the second rinse heads configured to provide a second liquid medium into the pocket of meniscus to substantially rinse the surface of the semiconductor wafer after the chemical clean, wherein each of the first chemical head, second chemical head, first rinse head and second rinse head comprising, an angled inlet conduit to deliver one of first or second liquid medium into the pocket of meniscus in a single phase, the angled inlet conduit located within the pocket of meniscus at a leading edge of each of the chemical and rinse heads;

an inner return conduit to remove one of the first or second liquid medium from the surface of the wafer in a single phase, the return conduit located within the pocket of meniscus at a trailing edge of each of the chemical or rinse heads; and a step formed along an outer periphery of the meniscus at the leading edge of each of the chemical and rinse heads so as to substantially confine the meniscus of the first or second liquid medium within the pocket, the step having a height that is sufficient to preserve confinement characteristic of the meniscus, wherein the inlet conduit is spaced apart from the step and directed into the pocket of meniscus so as to enable delivery of the first and second liquid medium in a single phase and wherein the liquid medium delivered by the first and second chemical heads is a liquid chemistry to substantially clean the surface of the wafer and the liquid medium delivered by the first and second rinse heads is a rinsing chemistry to substantially rinse the wafer surface after the chemical clean and wherein the first and second chemical heads are misaligned such that an outer wall of the step adjoining the pocket in the second chemical head disposed on the underside of the semiconductor wafer, when present, is extended outward in relation to the outer wall of the step adjoining the pocket of meniscus in the first chemical head disposed on the top of the semiconductor wafer, when present, and wherein the first and second rinse heads are misaligned such that an outer wall of the step adjoining the pocket in the second rinse head disposed on the underside of the semiconductor wafer, when present, is extended outward in relation to the outer wall of the step adjoining the pocket in the first rinse head disposed on the top of the semiconductor wafer, when present.

13. The system of claim 12, wherein each of the second chemical head and the second rinse head disposed at the underside of the semiconductor wafer includes a gutter formed at the leading edge, the gutters are configured to reclaim the first liquid medium and the second liquid medium that overflows from the pocket on the surface of the semiconductor wafer, when present.

14. The system of claim 12, wherein the first and second chemical heads and the first and second rinse heads are integrated into one unit such that the menisci of the first liquid medium and the second liquid medium are kept distinct.

15. The system of claim 12, wherein the first and second chemical heads and the first and second rinse heads are maintained distinct such that the meniscus of the first liquid medium and the second liquid medium may each be applied based on operating constraints associated with the first liquid medium and the second liquid medium, respectively.

16. The system of claim 15, wherein the operating constraints are dynamic and include one or more of temperature, flow rate, density, pressure.

17. The system of claim 12, wherein the second chemical head and the second rinse head are each configured so as to provide a pocket for the corresponding first and second liquid medium.

18. The system of claim 12, wherein the first chemical head and the first rinse head each include a surface facing the semiconductor wafer between an angled inlet conduit and an inner return conduit that is patterned so as to enhance wetting by the first liquid medium and the second liquid medium.

* * * * *